United States Patent
Marsili et al.

(10) Patent No.: US 11,372,054 B2
(45) Date of Patent: Jun. 28, 2022

(54) DEVICE AND METHOD FOR BATTERY IMPEDANCE MEASUREMENT

(71) Applicant: Infineon Technologies AG, Neubiberg (DE)

(72) Inventors: Stefano Marsili, Faak am See (AT); Klaus Hoermaier, Krumpendorf (AT); Akshay Misra, Munich (DE); Filippo Rosetti, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 203 days.

(21) Appl. No.: 16/657,259

(22) Filed: Oct. 18, 2019

(65) Prior Publication Data

US 2020/0132781 A1    Apr. 30, 2020

(30) Foreign Application Priority Data

Oct. 26, 2018 (DE) .......................... 102018126807.6

(51) Int. Cl.
*G01R 31/389* (2019.01)
*G01R 31/36* (2020.01)

(52) U.S. Cl.
CPC ....... *G01R 31/389* (2019.01); *G01R 31/3644* (2013.01)

(58) Field of Classification Search
None
See application file for complete search history.

(56) References Cited

U.S. PATENT DOCUMENTS

| 5,281,920 A * | 1/1994 | Wurst | G01R 31/389 324/430 |
| 2001/0002792 A1 * | 6/2001 | Bertness | H01M 10/48 324/430 |
| 2015/0008929 A1 * | 1/2015 | Ehrmann | B60L 58/12 324/426 |
| 2017/0160348 A1 * | 6/2017 | Din | H02J 7/0014 |

FOREIGN PATENT DOCUMENTS

| DE | 102011087678 A1 | 6/2013 |
| DE | 102013213946 A1 | 1/2015 |

OTHER PUBLICATIONS

Gray Ashley James; Circuit and Method for Coupling Electrical Energy to a Resonated Inductive Load; Date Published Apr. 8, 2010; Illsley Neville Roy Samuel; WO 2010039046 A2; H 05 B 6/06 (Year: 2010).*

* cited by examiner

*Primary Examiner* — Nasima Monsur
(74) *Attorney, Agent, or Firm* — Slater Matsil, LLP

(57) ABSTRACT

A device for battery impedance measurement includes a switched capacitor network, a controller configured to operate the switched capacitor network to cause an alternating current to flow between a battery and an energy storage; and measurement circuitry configured to measure the alternating current flowing to or from the battery and a voltage across the battery.

20 Claims, 13 Drawing Sheets

DEVICE AND METHOD FOR BATTERY IMPEDANCE MEASUREMENT

This application claims the benefit of German Application No. 102018126807.6, filed on Oct. 26, 2018, which application is hereby incorporated herein by reference in its entirety.

TECHNICAL FIELD

The present application relates to devices and methods for battery impedance measurement.

BACKGROUND

The impedance of a battery may give information regarding the battery, like temperature, state of charge or state of health (e.g., deterioration due to aging). Measuring such an impedance of a battery may for example be performed in electric vehicles to obtain information about a battery powering the electric vehicle.

Such impedance measurements are usually performed by injecting a sinusoidal current (positive, i.e., current flowing to the battery, or negative, i.e., current flowing from the battery) into the battery and measuring the injected current and the battery voltage reaction to the injected current at the same time. The measured voltage and current over time are then post-processed including forming a ratio between the voltage and the time, which gives the complex impedance of the battery at the frequency of the sinusoidal current.

In measurements which are isolated from the outside world, for example in a portable device or in a closed environment like a vehicle, unless an additional energy source is provided, energy can only be drawn from the battery to be measured, corresponding to a negative injected current. In other words, current is drawn from the battery in such scenarios. This approach to draw a sinusoidal current from a battery is used in various commercially available impedance measurement devices.

In automotive applications, lithium ion cells are usually used as batteries. Typical impedances of such cells are of the order of some hundred $\mu\Omega$. At high temperatures, where impedance measurements are of particular interest for safety reasons, the impedance of such lithium ion cells drops and is quite low. Therefore, in order to sense a significant voltage variation of the battery voltage, it is necessary to draw a comparatively high current from the battery. This leads to two problems. On the one hand, the impedance measurements using high current discharge the battery to a non-negligible extent, so the impedance measurements cannot be performed too often. On the other hand, discharging the battery with high currents leads to a corresponding high power dissipation. For example, assuming an average current of 1 A and a battery voltage of 4 V, about 4 W per battery could be dissipated to make such measurements. This might lead to hotspots and temperature variations of a measurement device during the measurement which may negatively impact the accuracy of the measurement.

SUMMARY

According to an embodiment, a device for battery impedance measurement is provided. The device comprises first terminals configured to be connected to a battery, and second terminals configured to be connected to an energy storage. The device further comprises a switched capacitor network coupled between the first terminals and the second terminals, and a controller configured to operate the switch capacitor network to cause an alternating current to flow between the battery and the energy storage. Additionally, the device comprises measurement circuitry configured to measure the alternating current to or from the battery and a voltage across the battery.

In another embodiment, a method for battery impedance measurement is provided, comprising: operating a switched capacitor network coupled between a battery and an energy storage to cause an alternating current to flow between the battery and the energy storage, and measuring the alternating current to or from the battery and a voltage across the battery.

The above summary is merely intended to give a brief overview over some embodiments and is not to be construed as limiting.

DETAILED DESCRIPTION OF ILLUSTRATIVE EMBODIMENTS

In the following, embodiments will be described in detail referring to the attached drawings. These embodiments are to be taken as examples only and are not to be construed as limiting in any way.

The term "coupled" or "connected" as used herein refers to electrical connections or couplings unless noted otherwise. Any direct electrical connection shown and described, i.e., any connection without any intervening elements (like a simple metal lead or wire) may also be replaced by an indirect connection or coupling, i.e., a connection or coupling comprising one or more additional intervening elements, and vice versa, as long as the general purpose of the connection or coupling, for example to transmit a current, a voltage or to provide a certain kind of control, is essentially maintained. In other words, connections or couplings may be modified as long as the purpose of the connection or coupling is essentially maintained.

Features from different embodiments may be combined to form further embodiments. Variations and details described for one of the embodiments are also applicable to other embodiments and will therefore not be described repeatedly.

Figure 1:
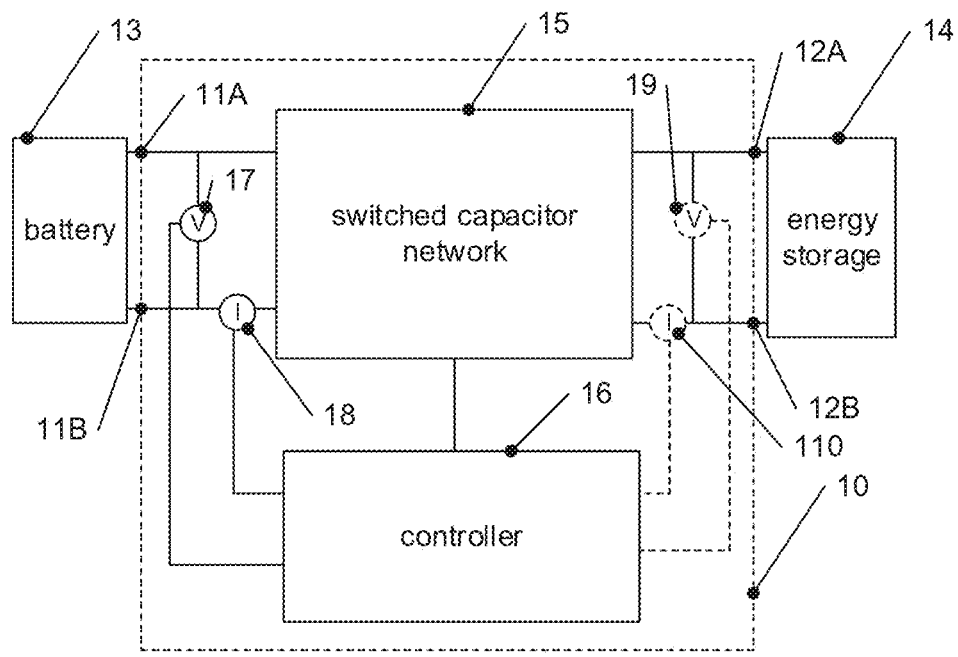
FIG. 1 is a block diagram of a device according to an embodiment.

FIG. 1 illustrates a measurement device 10 according to an embodiment. Measurement device 10 comprises first terminals 11A, 11B connected to a battery 13 and second terminals 12A, 12B connected to an energy storage 14. While first terminals 11A, 11B and second terminals 12A, 12B are shown as separate terminals in FIG. 1, they may also comprise a common terminal coupled both to battery 13 and energy storage 14. For example, first terminal 11B and second terminal 12A may be implemented as a single common terminal, as will be shown later referring to other figures. While battery 13 and energy storage 14 are shown outside device 10 in the embodiment of FIG. 1, in other embodiments, battery 13, energy storage 14 or both may be part of device 10.

An energy storage, as used herein, is any device which temporarily stores electrical energy. Examples for energy storages comprise capacitors, inductors, combinations of capacitors and inductors or also batteries. In other words, energy storage 14 may be a further battery in addition to battery 13.

Device 10 further comprises a switched capacitor network 15 coupled between first terminals 11A, 11B and second terminals 12A, 12B and therefore coupled between battery 13 and energy storage 14. A switched capacitor network is a network comprising one or more capacitors and switches. By selectively opening and closing the switches, the one or more capacitors may be coupled to first terminals 11A, 11B and/or second terminals 12A, 12B in different configurations. In some embodiments, switched capacitor network 15 may form a DC/DC voltage converter, in particular a step-up converter where the voltage is increased. A switch is referred to as closed when it provides a low-ohmic connection between its terminals, while it is referred to as open when it is essentially non-conducting between its terminals (possibly apart from small leakage currents depending on the implementation of the switch). It should be noted that switches as used herein may for example be implemented as transistors, for example field effect transistors like MOSFETs (metal oxide semiconductor field effect transistor), as bipolar junction transistors (BJT) or as insulated gate bipolar transistors (IGBT).

Switched capacitor network 15 is controlled by a controller 16. Controller 16 may be implemented in various ways, for example using dedicated hardware like application specific integrated circuits (ASICs) or field programmable gate arrays (FPGAs), but may also be implemented using one or more processors like microcontrollers or general purpose processors programmed accordingly to implement functions described herein. In operation, controller 16 controls switched capacitor network 15 such that an alternating current (AC) flows between battery 13 and energy storage 14. An alternating current, as used herein, is a current which changes its direction, so part of the time current flows from battery 13 to switched capacitor network 15 and from the switched capacitor network 15 to energy storage 14 and another part of the time current flows from energy storage 14 to switched capacitor network 15 and from the switched capacitor network 15 to the battery 13. In particular, the alternating current may be a periodic current, and in part each period of the periodic current flows from battery 13 to energy storage 14, and in another part of the period current flows from energy storage 14 to battery 13.

Furthermore, device 10 comprises a voltmeter 17 to measure a voltage between first terminals 11A, 11B and therefore a voltage across battery 13, also referred to as battery voltage. Voltmeter 17 may be implemented in any conventional manner, for example, using a high-ohmic measurement resistor across which the voltage is measured together with an analog-to-digital converter (ADC) to digitize the voltage. Furthermore, device 10 comprises an amperemeter 18 to measure a current flowing to and from battery 13, also referred to as battery current. Amperemeter 18 may be implemented in any conventional manner, for example by using a low-ohmic measurement resistor across which a voltage is measured together with an ADC or by using a current mirror, replica transistor or any other conventional arrangements for measuring current. By measuring the battery voltage and battery current, the battery impedance, which is a complex value, may then be determined by controller 16. In other embodiments, controller 16 may provide the battery voltage and battery current to another entity, for example a computing device, to calculate the battery impedance. In an automotive application, such another entity may be an electric control unit (ECU) of a vehicle.

By using energy storage 14, when current flows from battery 13 to energy storage 14, electrical energy is stored in energy storage 14. At least part of this energy then flows back from energy storage 14 to battery 13. In this way, at least not all energy flowing from battery 13 is dissipated, but instead at least part of it is stored in energy storage 14 and flows back to battery 13. Consequently, compared to conventional approaches, energy may be saved. It should be noted that while in an ideal system no losses occur, in practical implementations, losses occur both due to impedances of the components used and due to the operation of switched capacitor network 15, which has a limited efficiency in practical implementations.

In case energy storage 14 is a further battery as explained above, optionally device 10 may comprise a further voltmeter 19 to measure a voltage across this further battery 14 and a further amperemeter no to measure a further battery current to or from the further battery. In this way, also an impedance of the further battery may be measured, such that two impedances may be measured by device 10.

Figure 2:
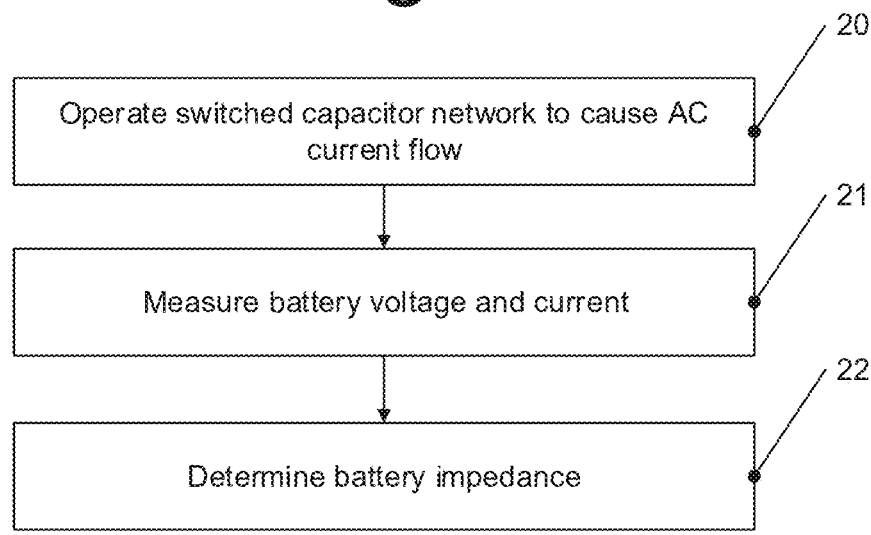
FIG. 2 is a flowchart illustrating a method according to an embodiment.

FIG. 2 is a flowchart illustrating a method according to an embodiment. The method of FIG. 2 may be implemented using the device of FIG. 1 and, to avoid repetitions, will be described referring to FIG. 1. However, it is to be understood that the method of FIG. 2 may also be implemented in other devices than the device explicitly shown in FIG. 1, for example in devices described further below.

At 20, the method comprises operating a switched capacitor network (for example switched capacitor network 15) to cause an alternating current flow between a battery (for example battery 13) and an energy storage (for example energy storage 14). At 21, the method comprises measuring a battery voltage and current, for example using voltmeter 17 and amperemeter 18. Optionally, also a further battery voltage and further battery current may be measured, using for example voltmeter 19 and amperemeter no of FIG. 1, in case the energy storage is a further battery. At 22, the method may comprise determining a battery impedance based on the battery voltage and current, for example in controller 16 or another entity as described above.

The battery impedance in FIG. 1 and FIG. 2 is determined for a frequency corresponding to a frequency of the AC current flow, as will be described later. In case it is of interest to determine the battery impedance for various impedance frequencies, the frequency of the AC voltage may be varied by varying a frequency with which the switched capacitor network is operated.

As mentioned initially, in conventional battery impedance measurement devices, a sinusoidal current is injected into the battery. In some embodiments, in order to further reduce current consumption, an essentially rectangular current may be used. An essentially rectangular current is a current where the AC current between a battery and an energy storage using a switched capacitor network is generated based on a rectangular control signal, i.e., the switched capacitor network essentially instantaneously switches between an operation where current flows from the battery to the energy storage and an operation where current flows from the energy storage to the battery. The exact waveform of the alternating current in such cases, for example due to properties of the switched capacitor network, may differ from an exact rectangular waveform. This will now be explained referring to FIG. 3.

Figure 3:
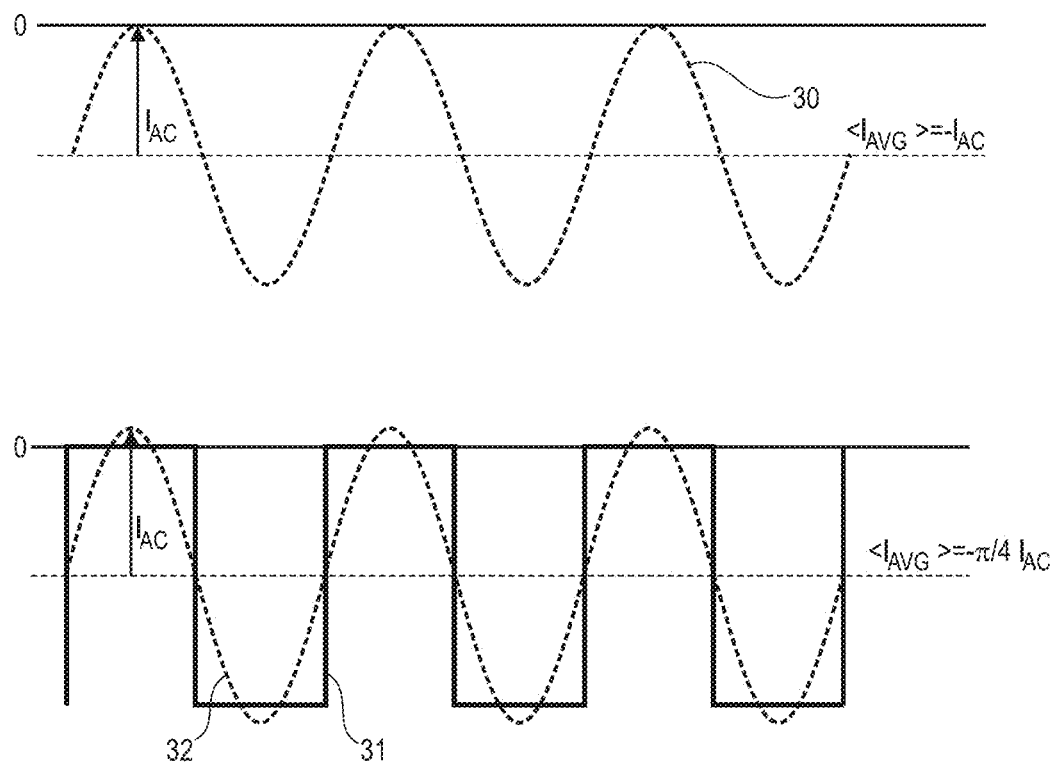
FIG. 3 is a diagram illustrating the use of rectangular waveforms in some embodiments.

In FIG. 3, a curve 30 shows a conventional approach where a sinusoidal current is drawn from a battery. The sinusoidal current has an amplitude $I_{AC}$, so that average current drawn is $-I_{AC}$ (in the notation used herein, a current flowing from the battery has a negative sign). It should be noted that in FIG. 3, it is assumed that current is only drawn from the battery, without using an energy storage as shown in FIGS. 1 and 2.

In contrast, additionally in FIG. 3 a rectangular injected current 31 is shown. With the same frequency as sinusoidal current 30, rectangular injected current 31 may be seen as a superposition of a fundamental sine wave 32 with sine waves of higher frequencies (higher harmonics) in sum forming rectangular injected current 32. When an amplitude of the fundamental sine wave shown as curve 32, which essentially corresponds to curve 30, is $I_{AC}$ (the same as curve 30), the amplitude of rectangular injected current 31 is reduced by a factor $\pi/4$. Therefore, when using a rectangular injected current, the average current is only $-\pi/4\, I_{AC}$. Consequently, in some embodiments, by using an essentially rectangular injected current, current consumption may be reduced when having essentially the same amplitude for the fundamental sine wave. It should be noted that such a rectangular injected battery current may be used generally in battery impedance measurements, independent of the techniques discussed for example with respect to FIGS. 1 and 2. However, as will be explained further below using examples, using an essentially rectangular current may also be combined with the techniques discussed with reference to FIGS. 1 and 2, where an AC current flows between a battery and an energy storage, which in this case is an essentially rectangular AC current. In this way, an additional current consumption reduction is possible in some embodiments.

Figure 4A:
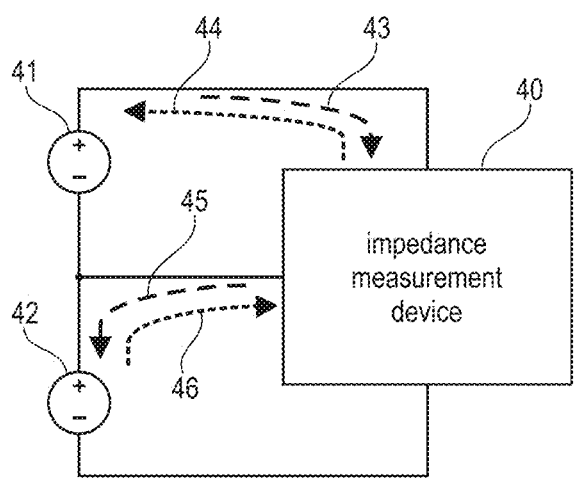
FIG. 4A is a block diagram of a device according to an embodiment.
Figure 4B:
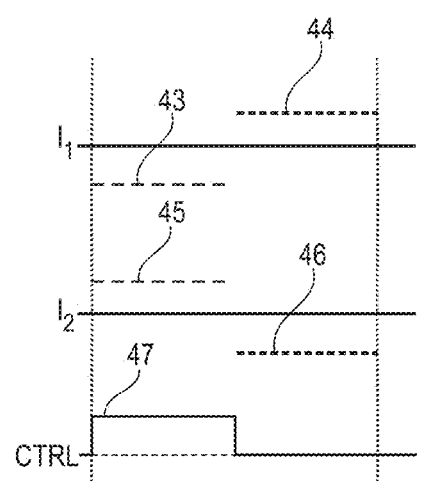
FIG. 4B illustrates example signals in the device of FIG. 4A.

FIG. 4A illustrates a device according to such an embodiment, and FIG. 4B illustrates example signals for the device of FIG. 4A. In FIG. 4A, an impedance measurement device 40 couples a battery 41 to an energy storage 42, which in this case is represented as a further battery. Impedance measurement device 40 comprises a switched capacitor network as explained referring to FIG. 1. The embodiment of FIG. 4 is an example where the first terminals coupled to the battery and the second terminals coupled to the energy storage have a common terminal, coupled to the negative (−) side of battery 41 and to the positive (+) side of energy storage 42 in FIG. 4A. Such an arrangement may be of interest if two or more batteries, also referred to as cells, are coupled in series and are to be measured individually. FIG. 4B illustrates some example signals for illustrating operation of the device of FIG. 4A.

A curve 47 illustrates a periodic control signal having a frequency $T0=1/f_0$, where $f_0$ is the control frequency. When control signal 47 is high, a current flows from battery 41 to impedance measurement device 40, as indicated by numeral 43 in FIGS. 4A and 4B, and from impedance measurement device 40 to energy storage 42, as indicated by reference numeral 45 in FIG. 4A. When control signal 47 is low, current flows from energy storage 42 to impedance measurement device 40 as indicted by reference numeral 46 and from impedance measurement device 40 to battery 41 as indicated by reference numeral 44. In FIG. 4B, a duty cycle of control signal 47 is about 50%. In other embodiments, other duty cycles may be used. Moreover, the frequency $f_0$ may be varied if an impedance measurement at different frequencies is desired.

Therefore, as shown in FIG. 4B, a battery current $I_1$ for battery 41 is negative (reference numeral 43) while control signal 47 is high and is positive (current flowing through battery 41) when control signal 47 is low. Conversely, when control signal 47 is high, a current $I_2$ associated with energy storage 42 is positive (current flowing to energy storage 42) and is negative (current flowing from energy storage 42) when control signal 47 is low.

The essentially abrupt switching between the two current flow directions according to control signal 47 gives the essentially rectangular current discussed above with reference to FIG. 3. It should be noted that the currents shown in FIG. 4B are schematic only, and depending on the implementation of a switched capacitor network of impedance measurement device 40, actual currents may differ from the exact rectangular shape shown, as will be explained further below. Again, in FIGS. 4A and 4B, in case energy storage 42 is a further battery, both the impedance of battery 41 and of the further battery may be measured. Moreover, as explained before, in an ideal case, no charge would be lost, while in real implementation losses occur.

Figure 5A:
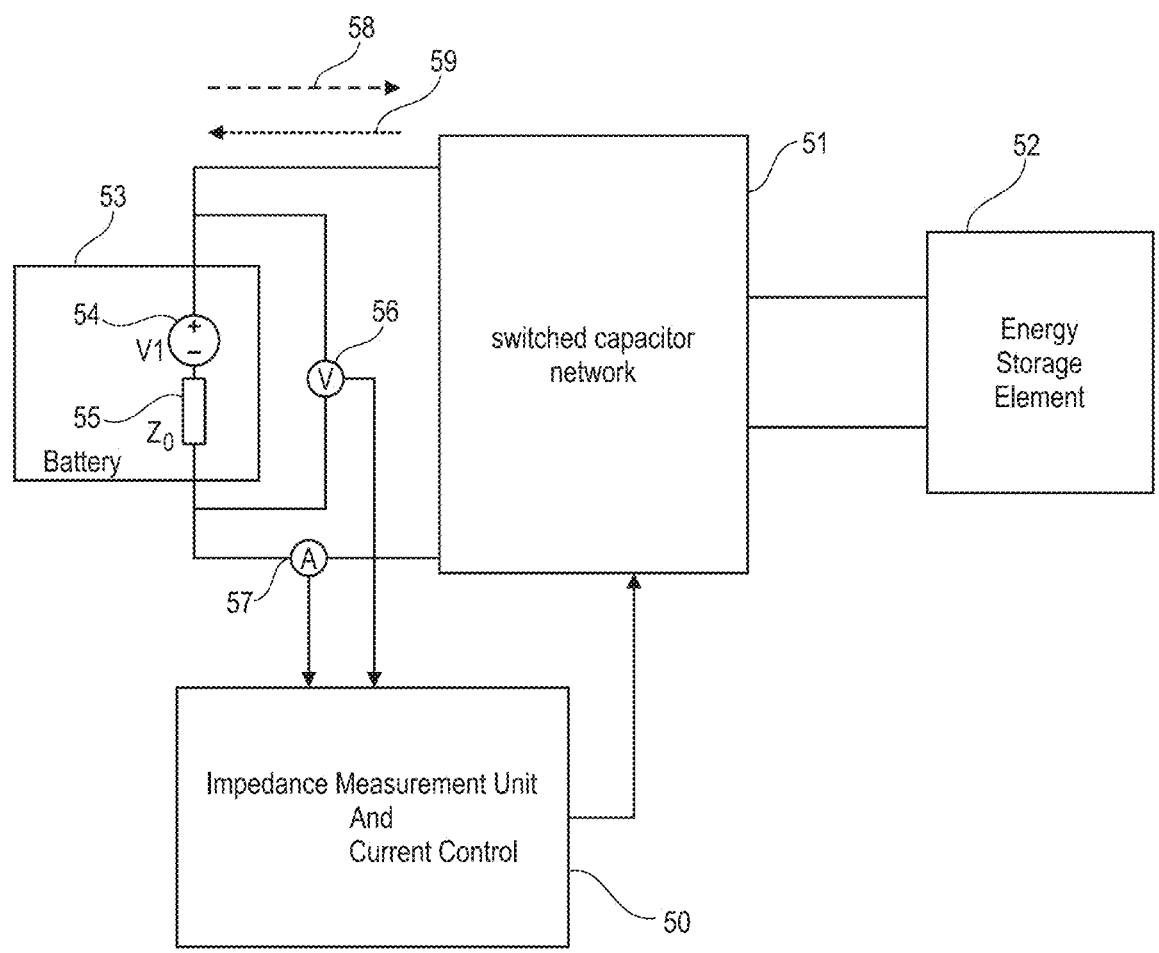
FIG. 5A illustrates a block diagram of a device according to an embodiment.

Next, referring to FIGS. 5-8, embodiments will be discussed where the energy storage is not a further battery (the impedance of which may be measured). FIG. 5A is a device according to a further embodiment, and FIG. 5B shows example signals in the device of FIG. 5A.

Figure 5B:
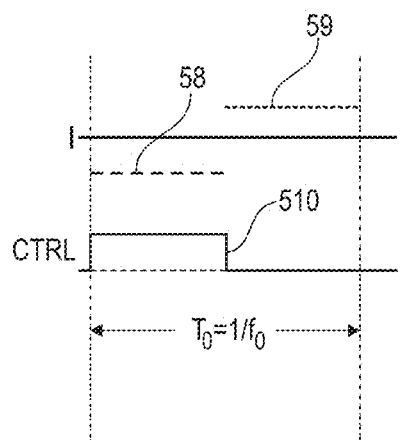
FIG. 5B shows example signals in the device of FIG. 5A.

The system of FIG. 5 comprises a controller 50 serving as an impedance measurement unit and as a controller for a current injected to a battery 53, the battery 53, a switched capacitor network 51, an energy storage element 52, a voltmeter 56 and an amperemeter 57. Voltmeter 56 and amperemeter 57 may be implemented in any conventional manner, as already explained with reference to FIG. 1. Battery 53 is represented as an ideal voltage source 54 coupled to an impedance 55 having an impedance value $Z_0$, which corresponds to the battery impedance to be measured. Energy storage element 52 may comprise one or more capacitors, one or more inductors or combinations of capacitors and inductors. Controller 50 controls switched capacitor network 51 according to a control signal 510 shown in FIG. 5B. When control signal 510 is high, switched capacitor network 51 is controlled such that a current generally denoted by reference numeral 58 in FIGS. 5A and 5B flows from battery 53 to switched capacitor network 51, which causes a further current to flow from switched capacitor network 51 to energy storage element 52. When control signal 510 is low, switched capacitor network 51 draws current from energy storage element 52 to provide a current generally labeled 59 flowing to battery 53. Control signal 510 again has a period $T0=1/f_0$ to measure the battery impedance $Z_0$ at a frequency $f_0$. Control signal 510 has a rectangular waveform, such that the current flow denoted by numerals 58 and 59 and shown in FIG. 5B has an essentially rectangular waveform, as mentioned above. Controller 50 then receives an indication of the battery voltage over time from voltmeter 56 and an indication of the battery current over time from amperemeter 57 and calculates the complex impedance while forming the ratio of voltage and current. An example for such a calculation will be discussed later.

Next, with reference to FIGS. 6-8, a device according to a further embodiment will be discussed which shows a specific non-limiting example for a switched capacitor network and an energy storage element. To avoid repetitions, for describing the embodiment of FIGS. 6-8, reference will be made to previous explanations.

Figure 6:
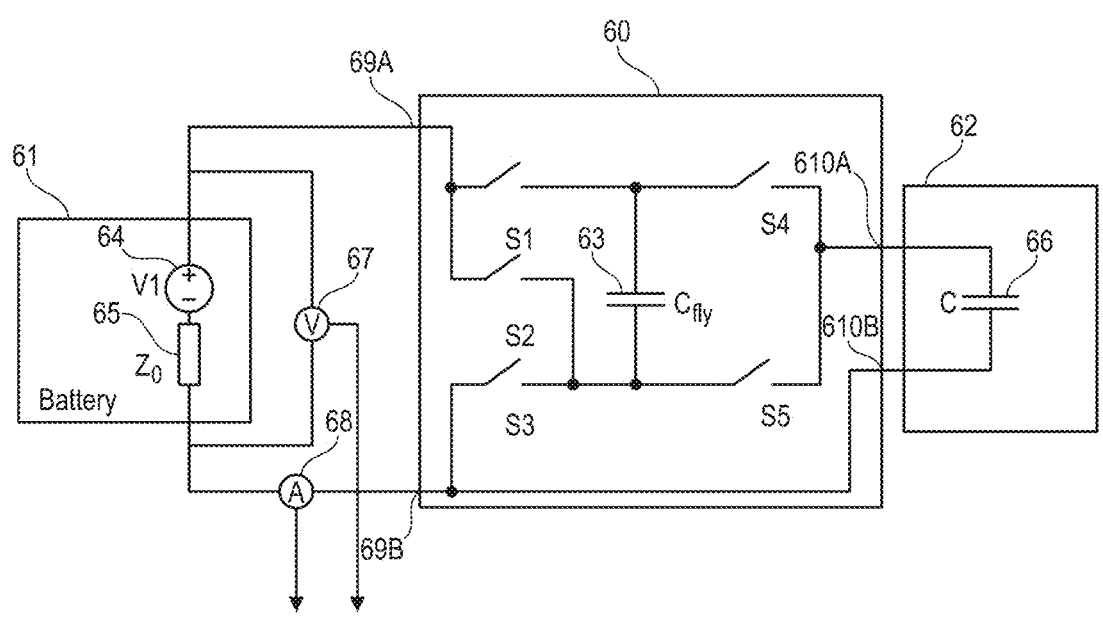
FIG. 6 is a circuit diagram of a device according to an embodiment.

FIG. 6 shows a circuit diagram of a device according to an embodiment. In FIG. 1, a switched capacitor network 60, a battery 61 and an energy storage 62 are shown. Battery 61 is shown as an ideal voltage source 64 coupled in series with an impedance 65 having an impedance value $Z_0$. Energy storage 62 is shown as comprising a capacitor 66 having a capacitance value C. The capacitance value C of capacitor 66 is selected so that capacitor 66 is able to store energy provided thereto from battery 61 via switched capacitor network 60 and may depend on the frequency $f_0$. For example, for $f_0=1$ kHz, C may be about 100 μF, and may scale inversely with frequency. For example, for $f_0=100$ Hz, C may be about 1000 μF, while for $f_0=1$ kHz, C may be about 10 μF.

The device of FIG. 6 further comprises a voltmeter 67 configured to measure a battery voltage of battery 61 and an amperemeter 68 for measuring a battery current of battery 61, corresponding to voltmeters and amperemeters discussed in previous embodiments. Switched capacitor network 60 is controlled by a controller like controller 50 of FIG. 5A or controller 16 of FIG. 1, which is not explicitly shown in FIG. 6.

Switched capacitor network 60 comprises five switches S1-S5 and a capacitor 63 having a capacitance value $C_{fly}$. A value of $C_{fly}$ may depend on a switching frequency with which the switches S1-S5 are operated and may for example be about 1 μF for a switching frequency of 2 MHz. Switches S1-S5 and capacitor 63 are coupled to form a step-up converter with a conversion ratio of 2:1. In other applications, other conversion ratios for voltage conversion may be used.

Switched capacitor network 60 has first terminals 69A, 69B coupled to battery 61 and second terminals 610A, 610B coupled to energy storage 66. As can be seen, terminals 69B and 610B are directly coupled with each other and may therefore also be implemented or seen as a common terminal, while terminals 69A, 610A are separate terminals.

Switch S1 is coupled between first terminal 69A and a first end of capacitor 63. Switch S2 is coupled between first terminal 69A and a second end of capacitor 63. Switch S3 is coupled between terminals 69B, 610B (which are coupled together as explained above) and the second end of capacitor 63. Switch S4 is coupled between the first end of capacitor 63 and second terminal 610A, and switch S5 is coupled between the second end of capacitor 63 and second terminal 610A.

Figure 7:
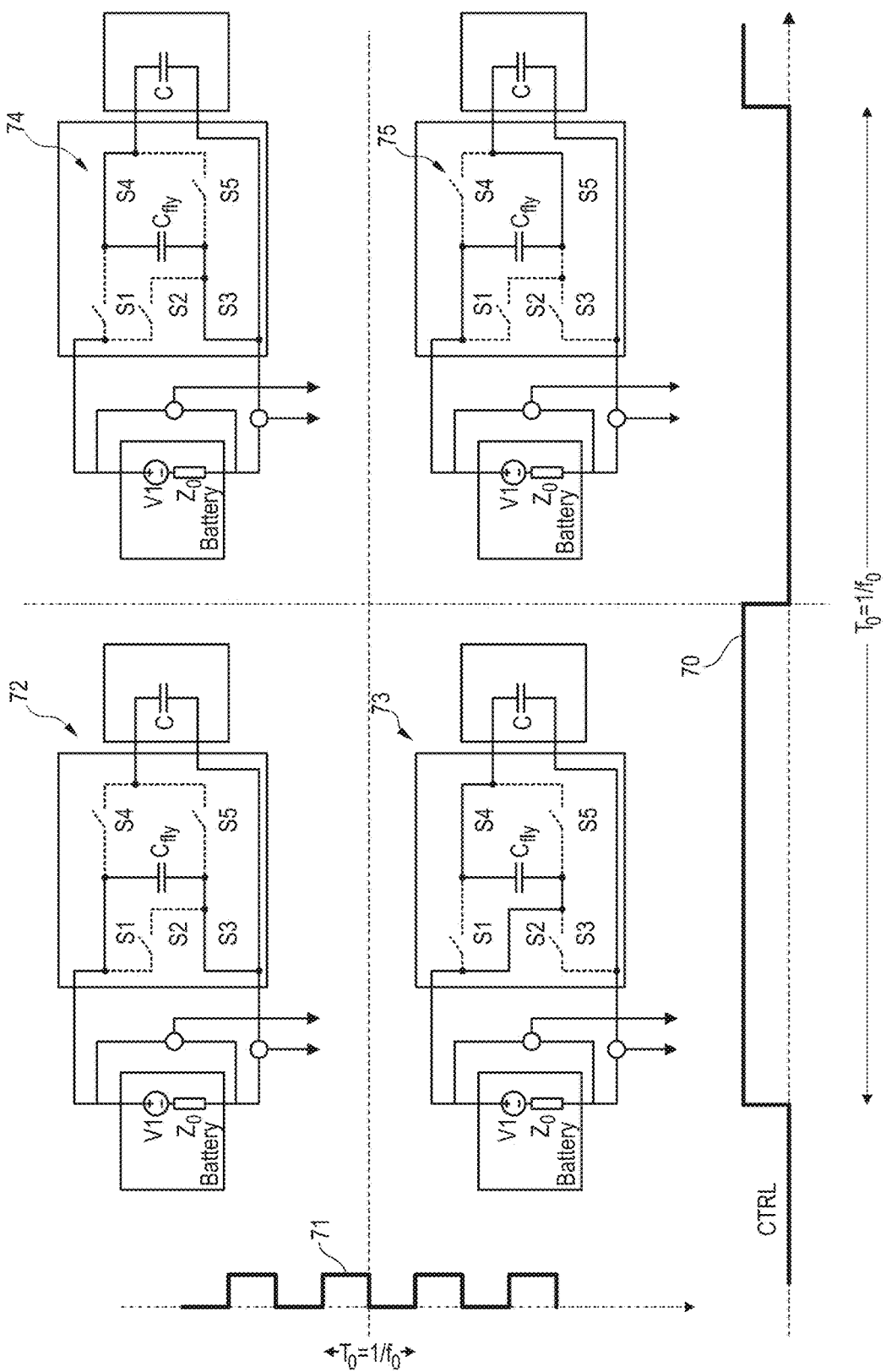
FIG. 7 illustrates an example operation for the embodiment of FIG. 6.

FIG. 7 illustrates an example operation of the switched capacitor network 60 of FIG. 6. For the example operation of FIG. 7, it is assumed that the impedance of battery 61 is measured at a frequency $f_0$. Therefore, control is according to a periodic control signal 70 having a period length $T_0=1/f_0$. When control signal 70 is high, current flows from battery 61 to energy storage 62, and when control signal 70 is low, current flows from energy storage 62 to battery 61.

When control signal 70 is high, a controller controls switched capacitor network 60 to switch between a first configuration 72 and a second configuration 73 with a switching frequency $f_{sw}$ corresponding to a switching period $T_{sw}=1/f_{sw}$, as illustrated by a curve 71 in FIG. 7. The switching frequency is typically significantly higher than the frequency $f_0$, for example at least two times, at least five times or at least ten times the frequency $f_0$, or even higher, like at least 100 or 1000 times the switching frequency $f_0$. The switching frequency may be larger than 500 kHz, for example about 2 MHz for a frequency $f_0$ of about 1 kHz. In first configuration 72, switches S1, S3 are closed, while switches S2, S4 and S5 are open. In second configuration 73, switches S2 and S4 are closed and switches S1, S3, S5 are open. In first configuration 72, capacitor 63 is charged by battery 61, while in second configuration 73, capacitor 63 provides charge to capacitor 66 of energy storage 62. In this way, effectively current is flowing from battery 61 to energy storage 62.

When control signal 70 is low, switched capacitor network 60 changes between a third configuration 74 and a fourth configuration 75 in the embodiment illustrated in FIG. 7. In third configuration 74, switches S3 and S4 are closed and switches S1, S2 and S5 are open. In fourth configuration 75, switches S2 and S5 are closed, and switches S2, S3 and S4 are open. In third configuration 74, essentially capacitor 63 is charged with energy from energy storage 62, and in fourth configuration 74, a current flows from capacitor 63 to battery 61, thus charging battery 61.

This results in an essentially rectangular AC current between battery 61 and energy storage 62.

Figure 8:
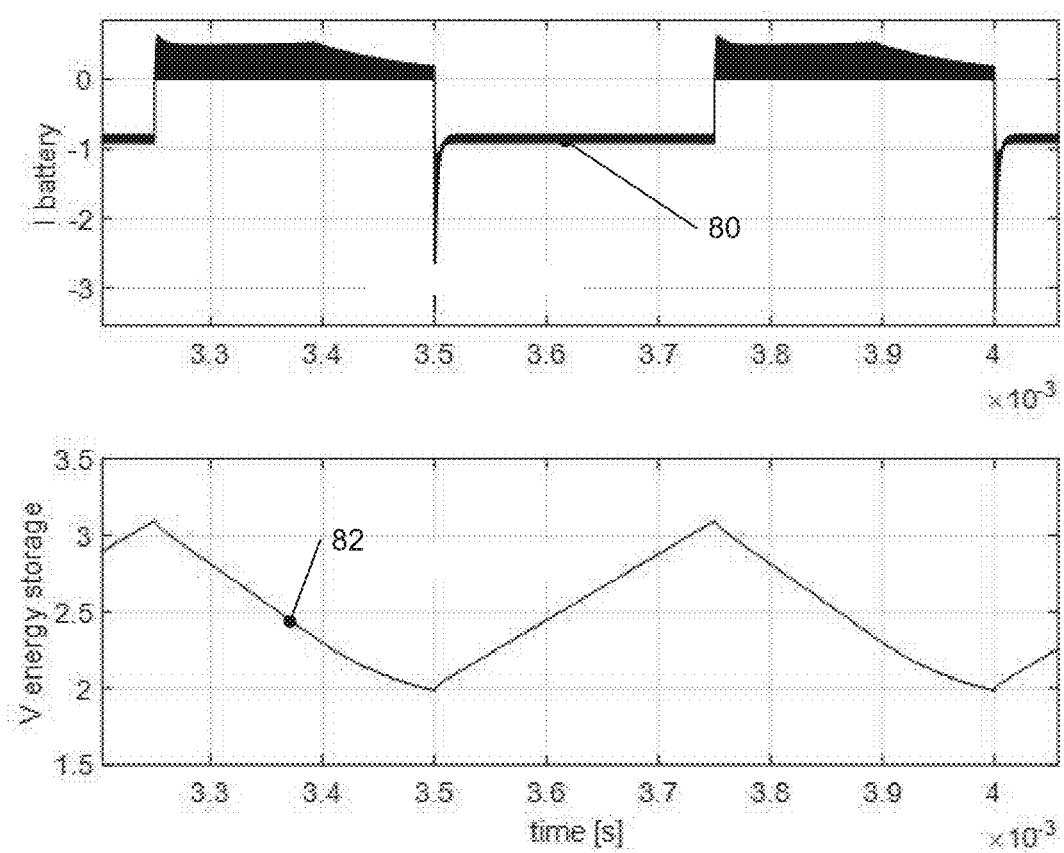
FIG. 8 illustrates simulated signals for a particular implementation of the embodiment of FIG. 6.

FIG. 8 illustrates simulation results for the device of FIG. 6 operated as explained referring to FIG. 7. A curve 80 shows the battery current as measured for example by amperemeter 68, a curve 82 shows the voltage across capacitor 66, each in arbitrary units. As can be seen, an essentially rectangular current flows, with deviations from the rectangular current inter alia due to the switching between the different configurations with the switching frequency $f_{sw}$.

To obtain a rectangular current, in the simulation the current was regulated in a closed loop based on the current measured by amperemeter 68. In such a regulation, switching for the switches is controlled based on the measured current and a target current. In some embodiments, for such a regulation the switching frequency $f_{sw}$ is kept constant, but resistance of the switches S1-S5 while in a closed state is varied depending on the measured current, thus controlling the amount of charge transferred. In case of transistor switches, the impedance may for example be controlled via the gate voltage or base voltage. In other embodiments, the switches in a closed state may be controlled to have a minimum impedance (fully closed), and the switching frequency $f_{sw}$ may be varied depending on the measured current. Generally, any closed loop control technique employed for switched capacitor DC/DC converters may be used. Such a regulation may not only be applied to the embodiment of FIGS. 6 and 7, but may also be applied to other embodiments discussed herein.

It should be noted that the configuration of switches shown in FIG. 6 and the operation thereof explained referring to FIG. 7 is only one non-limiting example for a switched capacitor network implementing a step-up converter with a 2:1 conversion ratio. Furthermore, converters with other conversion ratios like 3:2 or 4:3 may be implemented. Therefore, the configuration shown in FIG. 6 and the operation shown in FIG. 7 are merely non-limiting examples.

Figure 9:
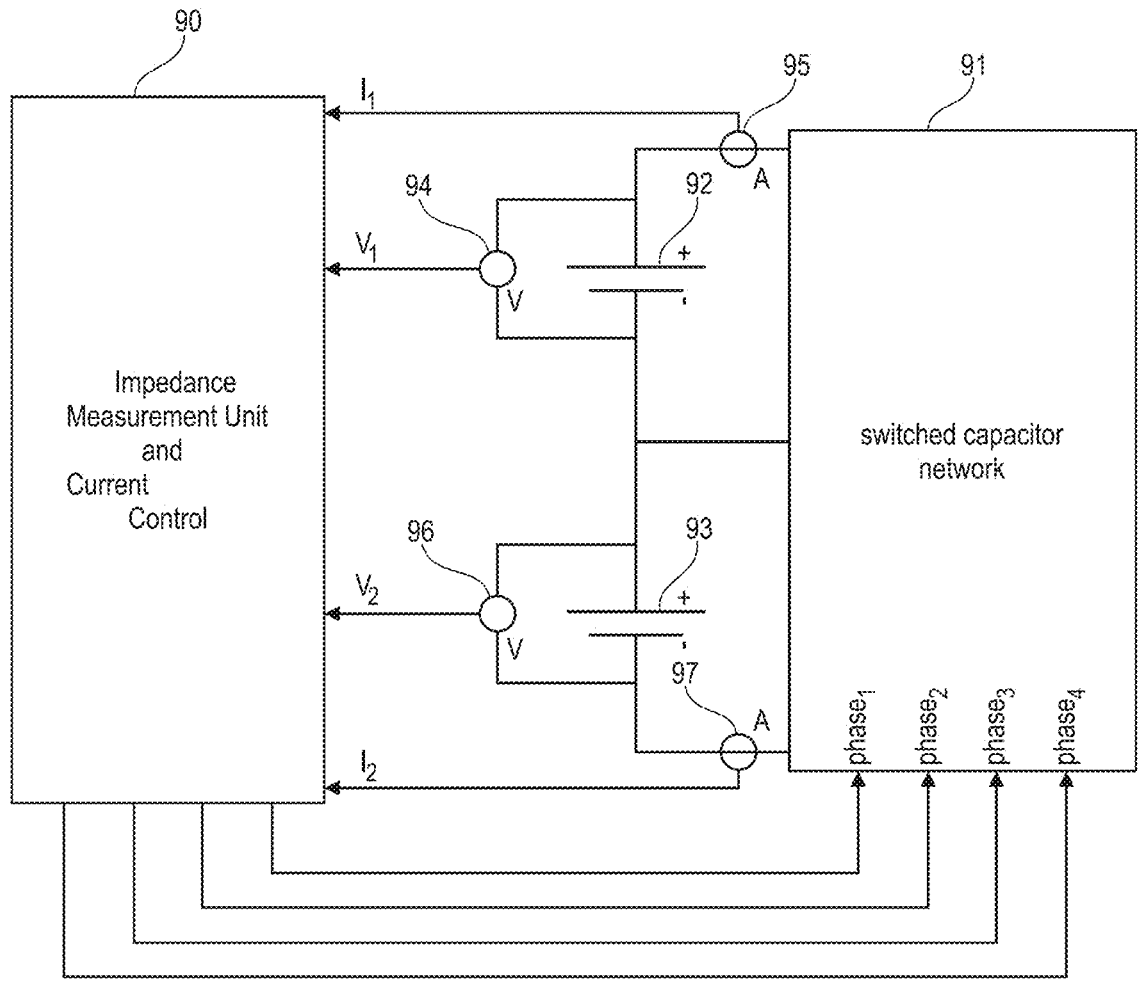
FIG. 9 is a block diagram of a device according to a further embodiment.

Next, various embodiments where two batteries are measured essentially at the same time will be discussed, i.e., embodiments where a further battery is used as an energy storage. FIG. 9 illustrates a schematic block diagram of a corresponding embodiment.

The embodiment of FIG. 9 comprises a controller 90, a switched capacitor network 91, a first battery 92, a second battery 93, a first voltmeter 94 configured to measure a first battery voltage $V_1$ across first battery 92, a first amperemeter 95 for measuring a first battery current $I_1$ to or from first battery 92, a second voltmeter 96 configured to measure a second battery voltage $V_2$ across second battery 93 and an amperemeter 97 configured to measure a second battery current $I_2$ to or from second battery 93. Controller 90 acts as impedance measurement unit and current control. For generating an AC current between first battery 92 and second battery 93, controller 90 controls switched capacitor network 91 to assume different switch configurations, as for example also explained with reference to FIG. 7 for switched capacitor network 60 of FIG. 6. In particular, four different configurations may be used, also referred to as four phases $phase_1$-$phase_2$, two configurations (for example $phase_1$ and $phase_2$) for generating a current flow from first battery 92 to second battery 93 and two configurations (for example $phase_3$ and $phase_4$) for generating current flow from second battery 93 to first battery 92. Voltmeters 94, 96 and amperemeters 95, 97 may be implemented as already discussed referring to FIG. 1.

In the embodiment of FIG. 9, controller 90 receives voltages $V_1$, $V_2$ and currents $I_1$, $I_2$ over time. Controlling of the switching may be done according to a control period. To as explained previously switching between two configurations during a first part of the control period and between two other configurations during a second part of the control period.

The control signal as well as a signal with the switching frequency $f_{sw}$ may be generated in the controller for example based on a counter clocked by a clock signal or in any other conventional manner for generating control frequencies.

In some embodiments, evaluation of the voltages $V_1(t)$, $V_2(t)$, $I_1(t)$ and $I_2(t)$ is as follows, where t denotes the time dependency.

Controller 90 generates a periodic phase signal P(t) with a frequency $f_0$ corresponding to the frequency of the control signal discussed below. In the example given below, P(t) forms a linear ramp from a value corresponding to 0° to a value corresponding to 360° in each period $T_0$, such that P(t) corresponds to a phase angle in each period.

Then, controller 90 in the embodiment of FIG. 9 calculates signals $V_{1,BB(t)}$, $I_{1,BB(t)}$, $V_{2,BB(t)}$ and $I_{2,BB(t)}$ according to:

$$V_{1,BB}(t)=V_1(t)*\sin(P(t))+jV_1(t)*\cos(P(t))$$

$$I_{1,BB}(t)=I_1(t)*\sin(P(t))+jI_1(t)*\cos(P(t))$$

$$V_{2,BB}(t)=V_2(t)*\sin(P(t))+jV_2(t)*\cos(P(t))$$

$$I_{2,BB}(t)=I_2(t)*\sin(P(t))+jI_2(t)*\cos(P(t))$$

which may be seen as a baseband mixing. In the above equations, sin is the sine function, cos is the cosine function and j is the imaginary unit. Next, DC (direct current) components of the four complex signals calculated as above are determined. The DC components are labeled $V_{1,BB\_DC}$, $V_{2,BB\_DC}$, $I_{1,BB\_DC}$ and $I_{2,BB\_DC}$. This extraction of the DC components may for example be achieved by calculating an average of the above signals $V_{1,BB}(t)$ etc. over an integer number of periods of the phase signal P(t). These DC components are also complex numbers. The complex impedances $Z_1$ for first battery 92 and $Z_2$ for second battery 93 for the frequency $f_0$ may then be calculated according to:

$$Z1(f_0) = \frac{V_{1,BB\_DC}}{I_{1,BB\_DC}}, Z2(f_0) = \frac{V_{2,BB\_DC}}{I_{2,BB\_DC}}.$$

It should be noted that the battery impedance for a single battery (for example in the embodiment of FIG. 5A or 6) may be calculated in the same manner, by just using the equations for index 1 (e.g., $V_1$, $I_1$) above.

In the above embodiments, the signals relevant for the measurement above (like P(t), switching frequency $f_{sw}$, control signal etc.) are derived from a single clock source. While embodiments using two separate measurement units using two clock sources may also be used, this may lead to either synchronization problems of the measurements and error propagation, or may lead to an extended measurement time in some implementations.

In other embodiments, more than two batteries may be measured, and a switched capacitor network may be used to transfer energy between more than two batteries.

Figure 10:
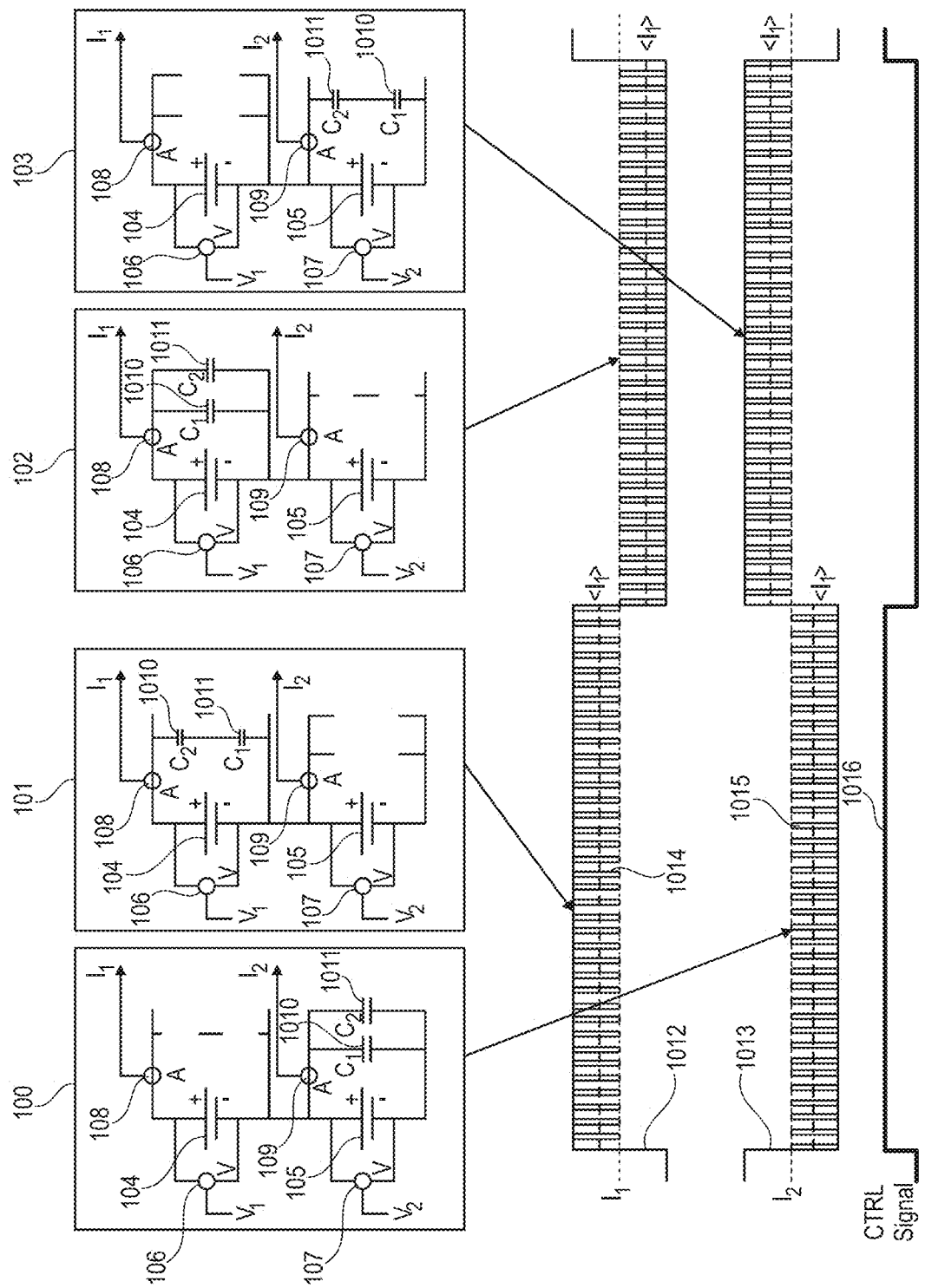
FIG. 10 illustrates operation of a device according to an embodiment.

Next, with reference to FIG. 10 an example for a basic operation of a switched capacitor network usable for measuring two batteries at the same time as in FIG. 9 will be explained. Specific implementations of such a network will then be discussed with reference to FIGS. 11A-11C. In FIG. 10, the switched capacitor network is operated as a step-up converter with a conversion ratio of 2:1. While in the embodiment of FIG. 6 for a single battery such a converter may comprise a single capacitor 63, in a case for two batteries the converter comprises a first capacitor 1010 and a second capacitor 1011. Generally, the essential reason is that with a single battery, a shared ground between the battery and the energy storage may be used. Instead, two batteries have separate grounds, such that one additional capacitor is needed in some implementations. In a case of a single battery, a converter having a conversion ratio of a:b may be implemented with a−1 capacitors (2−1=1 for the 2:1 conversion ratio of FIG. 6) while for two batteries a capacitors are needed in some implementations.

In FIG. 10, a device comprises a first battery 104, a second battery 105, a first voltmeter 106, a second voltmeter 107, a first amperemeter 108 and a second amperemeter 109, corresponding to first and second batteries 92, 93, first and second voltmeters 94, 96 and first and second amperemeters 95, 97 of FIG. 9. Of the switched capacitor network, only connections of first capacitor 1010 and second capacitor 1011 to batteries 104, 105 are shown in FIG. 10. As mentioned, an example implementation with corresponding switches will be discussed later with respect to FIG. 11.

Switching is generally controlled by a control signal 1016 having a control frequency $f_0$ and a corresponding control period $T_0=1/f_0$. When control signal 1016 is high, current flows from second battery 105 to first battery 104, corresponding to a positive battery current $I_1$ for first battery 104 as schematically illustrated by curve 1012 and a negative battery $I_2$ associated with second battery 105 as schematically illustrated by a curve 1013 in FIG. 10. Curves 1012, 1013 essentially show an envelope of the current. While control signal 1016 is high, the switched capacitor network changes between configurations 100, 101 according to a switching frequency $f_{sw}$, which actually leads to a pulsed current as indicated by curves 1014, 1015. In configuration 100, capacitors 1010, 1011 are coupled in parallel to terminals of second battery 105, as shown for configuration 100. Thus, the capacitors are charged. In configuration 101, capacitors 1010, 1011 are coupled in series between terminals of first battery 104, therefore charging battery 104. By coupling the capacitors in series, the effective voltage is increased corresponding to the conversion ratio of 2:1, allowing a charging of battery 104 (generally, for charging a battery, a charging voltage higher than the battery voltage is required).

When the control signal 1016 is low, the switched capacitor network changes between configurations 102, 103 according to the switching frequency $f_{sw}$. In configuration 102, capacitors 110, 111 are coupled in parallel between terminals of first battery 104, such that first battery 104 charges capacitors 1010, 1011. In configuration 103, capacitors 1010, 1011 are coupled in series between terminals of second battery 105, thus charging battery 105.

With such an embodiment, compared to a conventional case where a sinusoidal current is drawn from a battery for measurement and simply dissipated, a current consumption reduction of about 64% may be obtained. A step-up converter using two capacitors as shown in FIG. 10 has an efficiency of about 50%, and due to the essentially rectangular current waveform a current reduction of about 27% is possible. In other embodiments, other conversion ratios may be used, which may lead to higher efficiencies in some implementations.

Figure 11A:
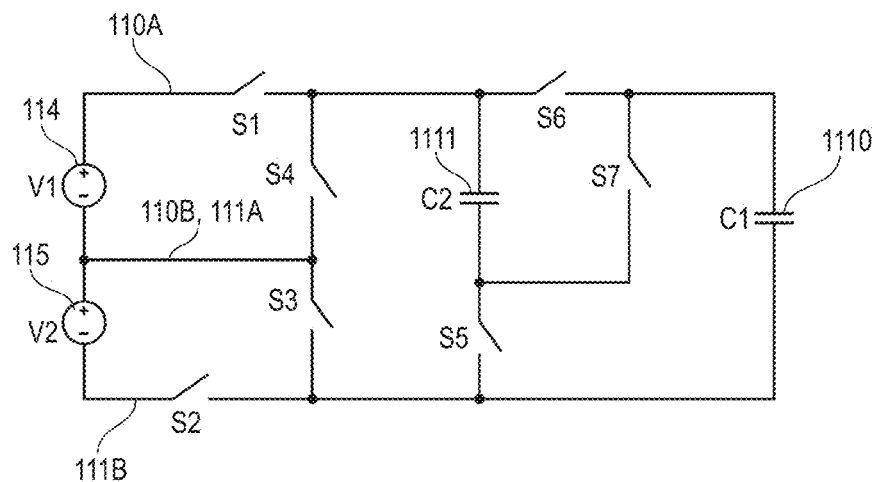
FIG. 11A illustrates an example of a switched capacitor network usable in some embodiments.

Next, an example implementation for a converter as discussed with reference to FIG. 10 will be discussed referring to FIGS. 11A-11D. FIG. 11A illustrates the basic circuit layout of a suitable switched capacitor network, and FIGS. 11B-11E show the configurations to obtain the couplings of capacitors as shown for configurations 100-103.

In the embodiment of FIG. 11A, a first capacitor 1110 and a second capacitor 1111 are provided having capacitance values $C_1$ and $C_2$, respectively. In embodiments, $C_1$ may be equal to $C_2$. First capacitor 1110 may correspond to first capacitor 1010 of FIG. 10 and second capacitor 1111 may correspond to second capacitor 1011 of FIG. 10. The switched capacitor network is coupled to a first battery 114, which may correspond to first battery 104 of FIG. 10, and to a second battery 115, which may correspond to second battery 105 of FIG. 10. Battery 114 is coupled to the switched capacitor network at first terminals 110A, 110B, and second battery 115 is coupled to the switched capacitor network at second terminals 111A, 11B. In the example of FIG. 11A, first terminal 110B, and second terminal 111A are formed as a common terminal.

The switched capacitor network of FIG. 11A comprises seven switches S1 to S7.

Switch S1 is coupled between first terminal 110A and a first end of second capacitor 111. Switch S2 is coupled between second terminal 111B and a second end of first capacitor 1110. Switch S3 is coupled between terminals 110B, 111A and the second end of first capacitor 1110. Switch S4 is coupled between the first end of second capacitor 1111 and terminals 110B, 111A. Switch S5 is coupled between a second end of second capacitor 1111 and the second end of capacitor 1110. Switch S6 is coupled between the first end of second capacitor 1111 and the first end of first capacitor 1110. Switch S7 is coupled between the first end of first capacitor 1110 and the second end of second capacitor 1111, as shown.

Operation of the switches to achieve configurations corresponding to configurations 100-103 in FIG. 10 will be explained next with reference to FIGS. 11B-11E.

Figures 11B, 11C:
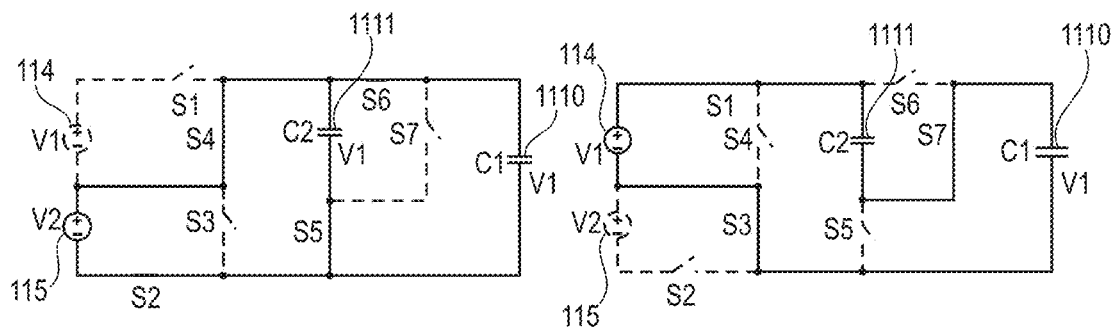
FIGS. 11B-11E illustrate operation of the switched capacitor network of FIG. 11A.
Figures 11D, 11E:
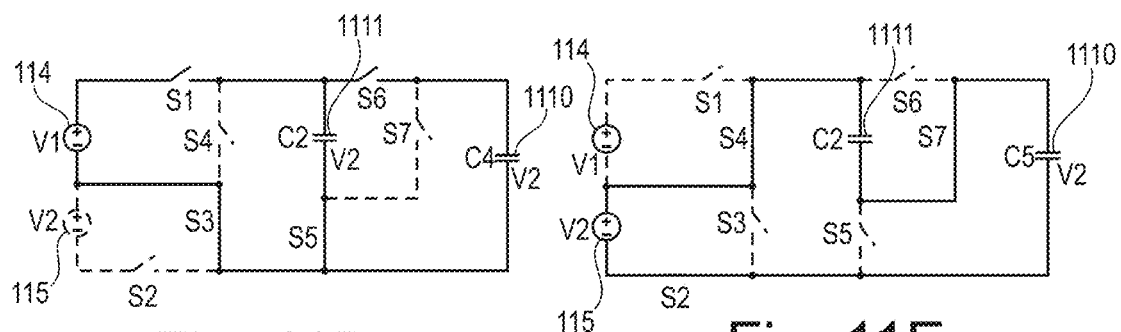

In FIG. 11B corresponding to configuration 100 of FIG. 10, switches S2, S4, S5 and S6 are closed, and the remaining switches are open, thus coupling capacitors 1110, 1111 in parallel to second battery 115. In FIG. 11C, corresponding to configuration 101, switches S1, S3, S7 are closed and the remaining switches are open, coupling capacitors 1110, 1111 in series between terminals 110A, 110B. In FIG. 11D corresponding to configuration 102, switches S1, S3, S5 and S6 are closed, coupling capacitors 1110, 1111 in parallel to first battery 114. In FIG. 11E, corresponding to configuration 103, switches S2, S4 and S7 are closed, coupling capacitors 1110, 1111 in series between terminals 111A, 111B. Therefore, with the switch configurations shown in FIG. 11A, the coupling of capacitors as discussed with reference to FIG. 10 may be achieved. These switch configurations are merely an example, and other switch configurations are also possible.

Figure 12A:
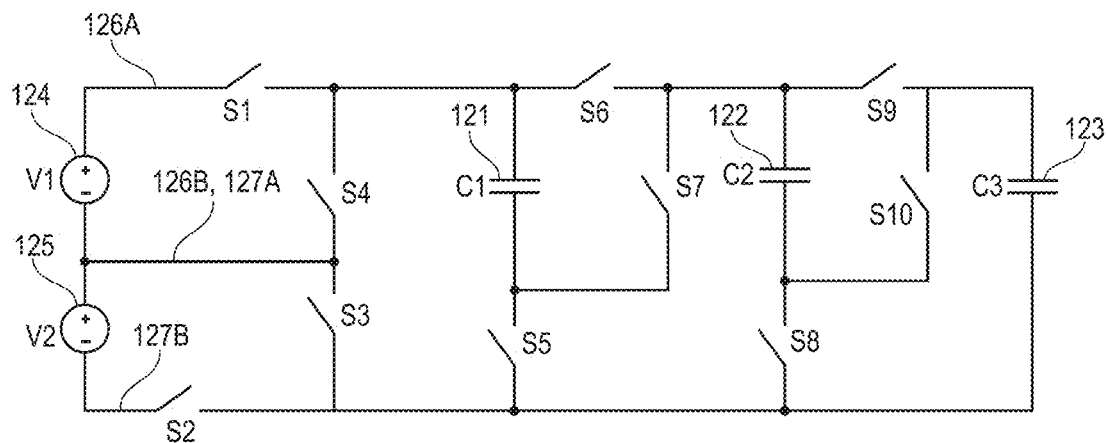
FIG. 12A illustrates a switched capacitor network usable in further embodiments.

As already mentioned with reference to FIG. 5, other conversion ratios besides 2:1 step-up converters are possible. As a non-limiting example, with reference to FIGS. 12A-12E, a 3:2 step-up converter for a two battery embodiment will be described. FIG. 12A shows an example implementation of such a converter, and FIGS. 12B-12E show various switching configurations.

FIG. 12A shows a switched capacitor network comprising three capacitors 121, 122, 123 having capacitances $C_1$, $C_2$ and $C_3$, respectively. In some embodiments, $C_1=C_2=C_3$. Furthermore, the switched capacitor network comprises switches S1 to S10 and is coupled to a first battery 124 at first terminals 126A, 126B and coupled to a second battery 125 at second terminals 127A, 127B. First terminal 126B and second terminal 127A are formed as a common terminal in the embodiment of FIG. 12A. Other components of a device like a controller may be implemented essentially as explained with respect to previous embodiments, now controlling switches S1 to S10 to provide an essentially rectangular AC current flow between first battery 124 and second battery 127.

Switch S1 is coupled between first terminal 126A and a first end of capacitor 121. Switch S2 is coupled between second terminal 127B and a second end of capacitor 123. Switch S3 is coupled between terminals 126B, 127A and the second end of capacitor 123. Switch S4 is coupled between terminals 126B, 127A and the first end of capacitor 121. Switch S5 is coupled between a second of end of capacitor 121 and the second end of capacitor 123. Switch S6 is coupled between the first end of capacitor 121 and a first end of capacitor 122. Switch S7 is coupled between the second end of capacitor 121 and the first end of capacitor 122. Switch S8 is coupled between a second end of capacitor 122 and the second end of capacitor 123. Switch S9 is coupled between the first end of capacitor 122 and a first end of capacitor 123. Switch S10 is coupled between a second end of capacitor 122 and the first end of capacitor 123.

Operation of the switched capacitor network of FIG. 12A will now be described referring to FIGS. 12B-12E. FIGS. 12B-12E show various configurations of the switched capacitor network. When current flows from second battery 125 to first battery 124, configurations of FIGS. 12B and 12C may alternatingly be applied with a switching frequency $f_{sw}$, for example while a control signal like control signal 1016 of FIG. 10 is high. When current flows from first battery 124 to second battery 125, the configurations shown in FIGS. 12D and 12E are alternatingly applied with switching frequency $f_{sw}$, for example while a control signal like control signal 1016 of FIG. 10 is low. In other words, the basic mechanism is the same as in previously described embodiments, i.e., different switching configurations are alternatingly applied to cause the AC current flow.

Figure 12B:
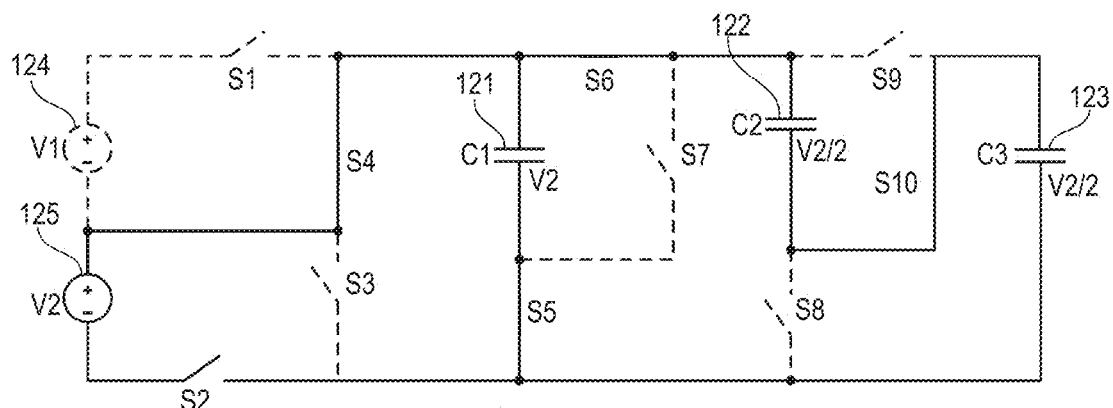
FIGS. 12B-12E illustrate operation of the switched capacitor network of FIG. 12A.

In FIG. 12B, switches S2, S4, S5, S6 and S10 are closed, and the remaining switches are open. Capacitor 121 is therefore coupled in parallel to second battery 125, and a series connection of capacitors 122 and 123 is also coupled in parallel to battery 125 and to capacitor 121. Therefore, capacitor 121 is charged with a voltage $V_2$ of second battery 125, and, assuming that $C_1=C_2=C_3$ as mentioned above, capacitors 122 and 123 are each charged to a voltage $V_2/2$.

Figure 12C:
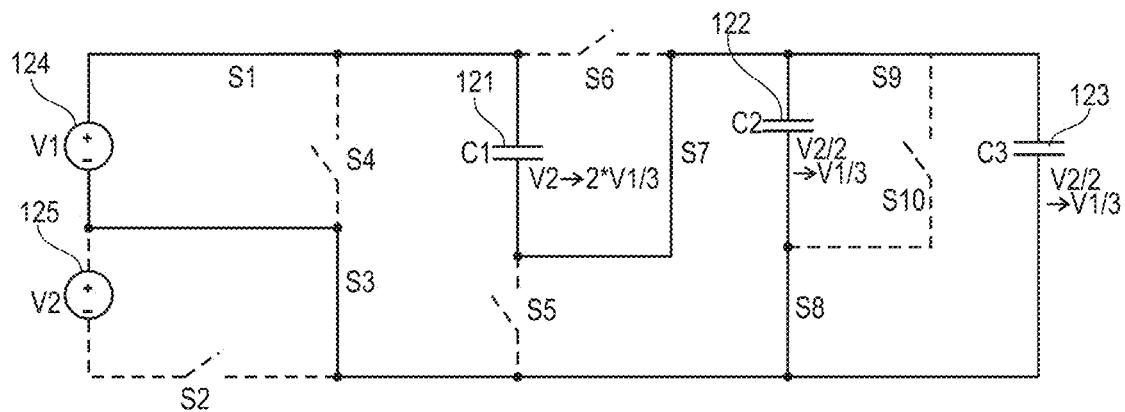
Figure 12D:
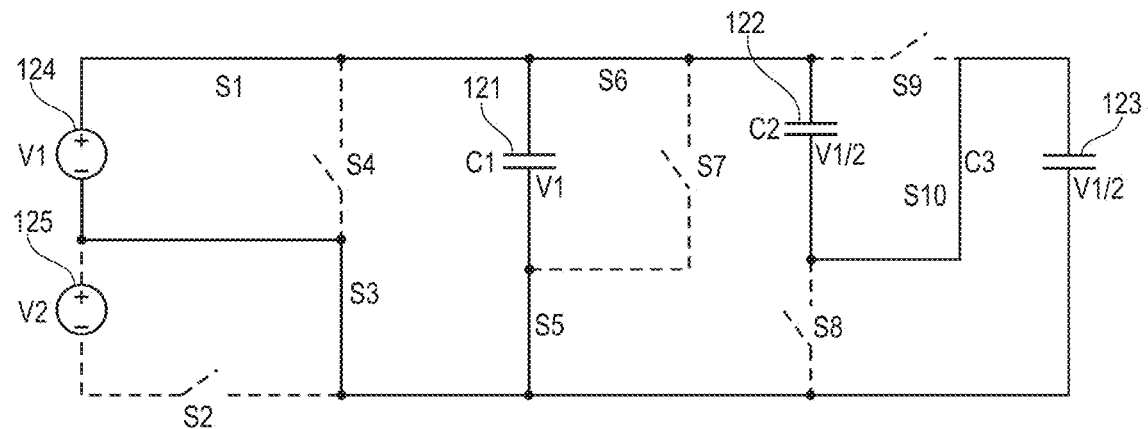
Figure 12E:
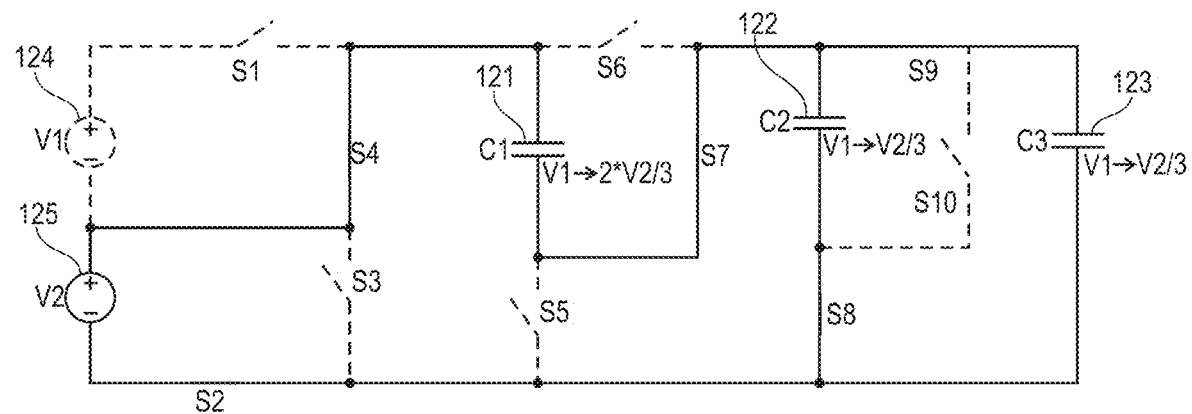

In FIG. 12C, switches S1, S3, S7, S8 and S9 are closed and the remaining switches are open. A series connection of capacitors 121, 122 is coupled in parallel to first battery 124, and capacitor 123 is coupled in parallel thereto. The resulting charge distribution causes a current flow from capacitors 121 to 123 charging first battery 124.

In FIG. 12D, switches S1, S3, S5, S6 and S10 are closed, such that capacitor 121 is coupled in parallel to first battery 124, and a series connection of capacitors 122, 123 is coupled in parallel thereto. This essentially corresponds to the situation in FIG. 12B, with the exception that the capacitors are now coupled to first battery 124 instead of being coupled to second battery 125. Therefore, the capacitors are charged by first battery 124. In FIG. 12E, switches S2, S4, S7, S8 and S9 are closed, and the remaining switches are open. This essentially corresponds to the situation in FIG. 12C, with the exception that now the capacitors are coupled to second battery 125 instead of first battery 124. Second battery 125 is charged by capacitors 121, 122, 123.

As already mentioned, FIGS. 12A-12E merely show one further example of a converter, and many other arrangements of switched capacitor networks are possible, for example implemented as step-up converters with varying conversion ratios a:b.

Figure 13A:
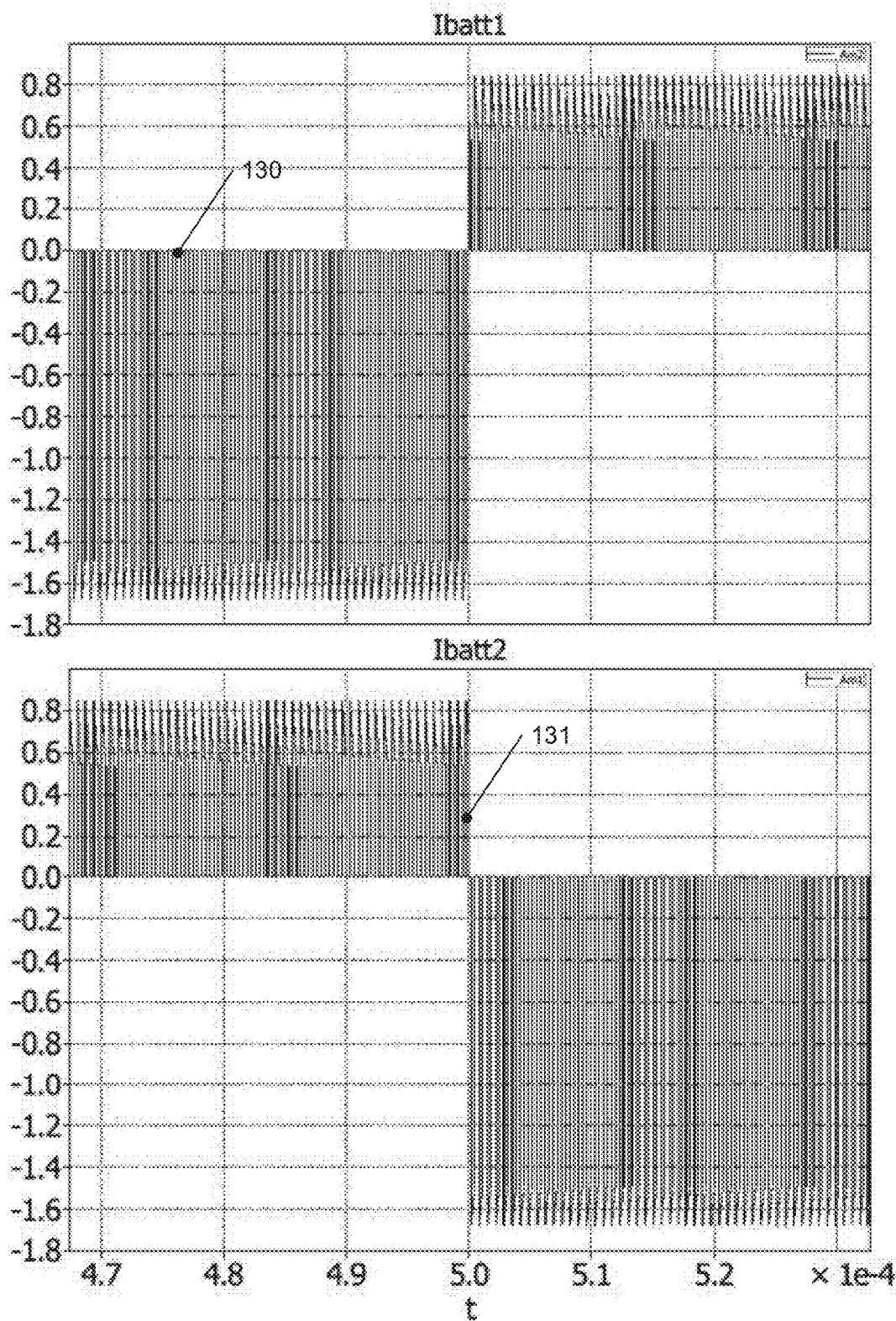
FIG. 13A illustrates simulation results for a particular implementation of a device with two batteries.
Figure 13B:
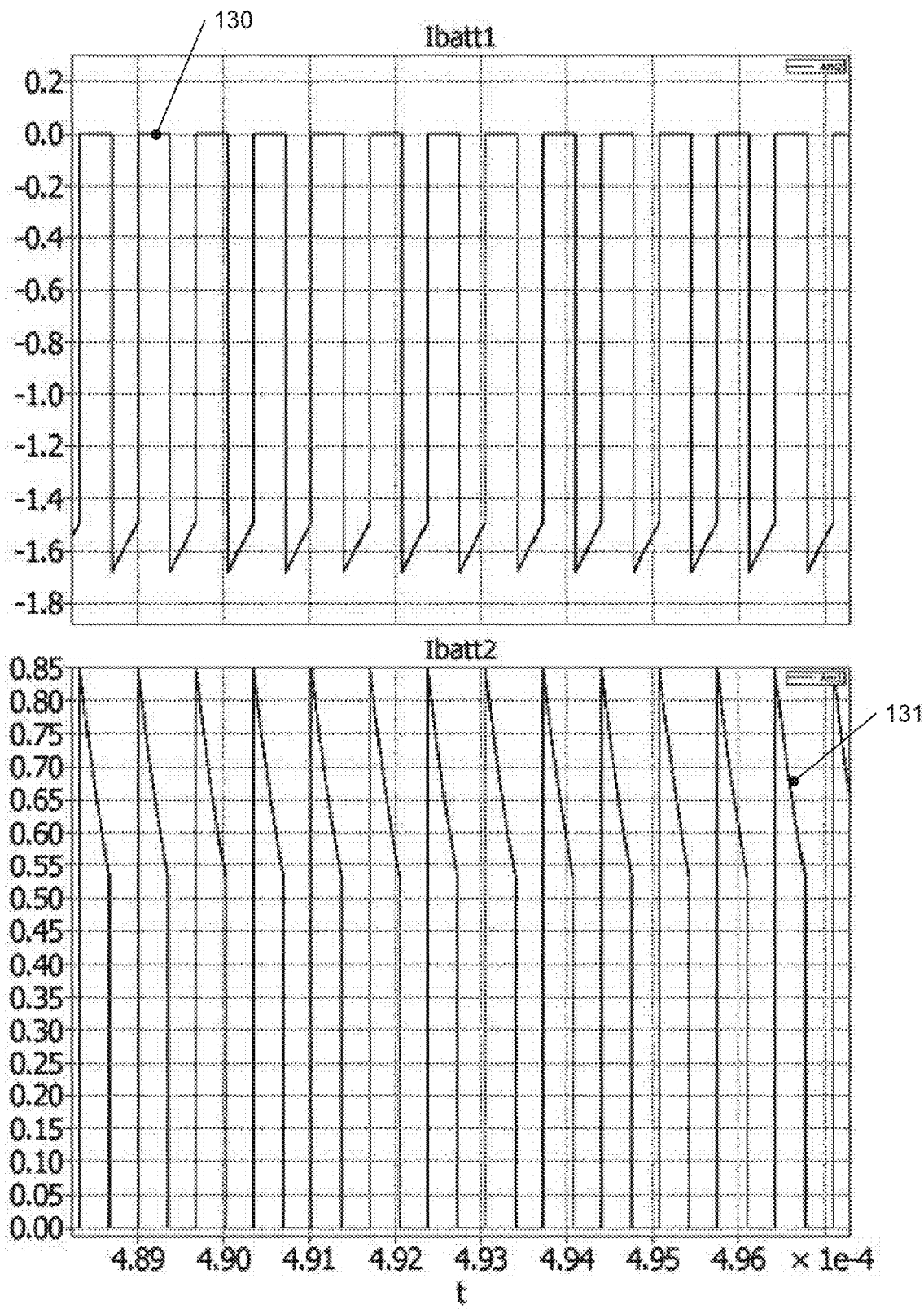
FIG. 13B shows a magnified version of some portions of FIG. 13A.

To further illustrate embodiments where two batteries are used, FIGS. 13A and 13B show simulated currents for a particular implementation of the embodiment of FIG. 10. A curve 130 in FIG. 13A shows the battery current of first battery 104, and a curve 131 shows the battery current of second battery 105. FIG. 13B shows a magnified view of portions of curves 130, 131 of FIG. 13A. Negative currents flow from the respective battery, while positive currents flow to the respective battery.

As can be seen in FIG. 13A, the current flowing has an essentially rectangular waveform in the sense explained above, i.e., the current envelope having the measurement frequency $f_0$ is essentially rectangular. Furthermore, as can be seen, as switched capacitor networks have an efficiency below 100%, the current flowing from one battery is greater than the corresponding current flowing to the respective other battery.

Some embodiments are defined by the following examples:

Example 1

A device for battery impedance measurement, comprising:
first terminals configured to be connected to a battery,
second terminals configured to be connected to an energy storage,
a switched capacitor network coupled between the first terminals and the second terminals,
a controller configured to operate the switched capacitor network to cause an alternating current to flow between the battery and the energy storage, and
measurement circuitry configured to measure the alternating current flowing to or from the battery and a voltage across the battery.

Example 2

The device of example 1, wherein the controller is further configured to determine a battery impedance of the battery based on the measured alternating current and voltage across the battery.

Example 3

The device of example 1 or 2, wherein the controller is configured to operate the switched capacitor network such that the alternating current has a rectangular waveform.

Example 4

The device of any one of examples 1-3, wherein the controller is further configured to cause that, in a first part of a period of the alternating current, current flows from the battery to the energy storage, and, in a second part of the period, current flows from the energy storage to the battery.

Example 5

The device of example 4, wherein the controller is further configured to control the switched capacitor to repeatedly change between a first switch configuration and a second switch configuration during the first part of the period, and to repeatedly change between a third switch configuration and a fourth switch configuration during the second part of the period.

Example 6

The device of any one of examples 1-5, wherein the switched capacitor network is configured as a step-up converter.

Example 7

The device of example 6, wherein the switched capacitor network comprises:
a capacitor,
a first switch coupled between a first one of the first terminals and a first end of the capacitor,
a second switch coupled between the first one of the first terminals and a second end of the capacitor,
a third switch coupled between a second one of the first terminals and the second end of the capacitor, a fourth switch coupled between the first end of the capacitor and a first one of the second terminals, a fifth switch coupled between the second end of the capacitor and the first one of the second terminals, and wherein the second one of the first terminals is coupled to a second one of the second terminals.

Example 8

The device of example 5 and of example 7, wherein in the first switch configuration, the first and third switches are closed, and the second, fourth and fifth switches are open, wherein in the second switch configuration, the second and fourth switches are closed, and the first, third and fifth switches are open, wherein in the third switch configuration, the third and fourth switches are closed, and the first, second and fifth switches are open, and wherein in the fourth switch configuration, the first and fifth switches are closed, and the second, third and fourth switches are open.

Example 9

The device of example 6, wherein a step-up ratio of the step-up converter is a:b, a and b being integer numbers, with a>b, and wherein a number of capacitors of the switched capacitor network is at least a+1.

Example 10

The device of example 5, wherein the switched capacitor network comprises a first capacitor and a second capacitor, wherein:

in the first switch configuration, the first and second capacitors are coupled in parallel between a first one of the second terminals and a second one of the second terminals, in the second switch configuration, the first and second capacitors are coupled in series between a first one of the first terminals and a second one of the first terminals, in the third switch configuration, the first and second capacitors are coupled in parallel between the first one of the first terminals and the second one of the first terminals, and in the fourth switch configuration, the first and second capacitors are coupled in series between the first one of the second terminals and the second one of the second terminals.

Example 11

The device of any one of examples 5, 6 or 10, wherein the switched capacitor network includes:

a first capacitor, a second capacitor, a first switch coupled between a first one of the first terminals and a first end of the second capacitor, a second switch coupled between a second one of the second terminals and a second end of the first capacitor, a third switch coupled between the second end of the first capacitor and a node, wherein the node is coupled to a second one of the first terminals and a first one of the second terminals, a fourth switch coupled between the first end of the second capacitor and the node, a fifth switch coupled between a second end of the second capacitor and the second end of the first capacitor, a sixth switch coupled between the first end of the first capacitor and a first end of the second capacitor, and a seventh switch coupled between the first end of the first capacitor and a second end of the second capacitor.

Example 12

The device of any one of examples 1-11, further comprising the energy storage, wherein the energy storage comprises at least one of a capacitor or a coil.

Example 13

The device of any one of examples 1-11, wherein the second terminals are configured to be connected to a further battery as the energy storage, wherein the measurement circuitry is further configured to measure a voltage across the further battery and the alternating current flowing to or from the further battery.

Example 14

The device of example 13, wherein the controller is further configured to determine a further battery impedance of the further battery based on the measured alternating current flowing to or from the further battery and the voltage across the further battery.

Example 15

The device of example 13 or 14, further comprising the battery and the further battery.

Example 16

The device of any one of examples 1-15, wherein one of the first terminals and one of the second terminals form a common terminal or are directly connected with each other.

Example 17

A method for battery impedance measurement, comprising:

operating a switched capacitor network coupled between a battery and an energy storage to cause an alternating current to flow between the battery and the energy storage, and measuring the alternating current flowing to or from the battery and a voltage across the battery.

Example 18

The method of example 17, further comprising determining a battery impedance of the battery based on the measured alternating current to or from the battery and voltage across the battery.

Example 19

The device of example 17 or 18, wherein operating the switched capacitor network comprises operating the switched capacitor network such that the alternating current has a rectangular waveform.

Example 20

The method of any one of examples 17-19, wherein the method comprises, in a first part of a period of the alternating current, causing current to flow from the battery to the energy storage, and in a second part of the period, causing current to flow from the energy storage to the battery.

Example 21

The method of example 20, further comprising repeatedly changing the switched capacitor network between a first switch configuration and a second switch configuration during the first part of the period, and repeatedly changing the switched capacitor network between a third switch configuration and a forth switch configuration during the second part of the period.

Example 22

The method of any one of examples 17-21, wherein the switched capacitor network is configured as a step-up converter.

Example 23

The method of example 22, wherein a step-up ratio of the converter is a:b, a and b being integer numbers, with a>b and wherein a number of capacitors of the switched capacitor network is at least a+1.

Example 24

The method of any one of examples 17-23, wherein the energy storage comprises at least one of a capacitor or a coil.

Example 25

The method of any one of examples 16-22, wherein the energy storage comprises a further battery,
wherein the method further comprises measuring a voltage across the further battery and the alternating current flowing to or from the further battery.

Example 26

The method of example 25, wherein the method further comprises determining a further battery impedance of the further battery based on the measured alternating current to or from the further battery and voltage across the further battery.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device for battery impedance measurement, comprising:
    first terminals configured to be connected to a battery;
    second terminals configured to be connected to an energy storage;
    a switched capacitor network coupled between the first terminals and the second terminals,
    a controller configured to operate the switched capacitor network to cause an alternating current to flow between the battery and the energy storage over a plurality of first cycles at a first frequency, wherein in each of the plurality of first cycles the controller is configured to
        cause the switched capacitor network to transfer charge from battery to the energy storage over a plurality of adjacent second cycles, and
        cause the switched capacitor network to transfer charge from the energy storage to the battery over a plurality of adjacent third cycles, wherein a frequency of the second cycles and a frequency of the third cycles is greater than the first frequency; and
    an amperemeter configured to measure the alternating current flowing to or from the battery and a voltmeter configured to measure a voltage across the battery.

2. The device of claim 1, wherein the controller is further configured to determine a battery impedance of the battery based on the measured alternating current and voltage across the battery.

3. The device of claim 1, wherein the controller is configured to operate the switched capacitor network such that the alternating current has a rectangular waveform.

4. The device of claim 1, wherein the controller is further configured to:
    in a first part of a period of the alternating current, cause current to flow from the battery to the energy storage; and
    in a second part of the period of the alternating current, cause current to flow from the energy storage to the battery.

5. The device of claim 4, wherein the controller is further configured to control the switched capacitor network to repeatedly change between a first switch configuration and a second switch configuration during the first part of the period of the alternating current, and to repeatedly change between a third switch configuration and a fourth switch configuration during the second part of the period of the alternating current.

6. The device of claim 5, wherein the switched capacitor network comprises a first capacitor and a second capacitor, wherein:
    in the first switch configuration, the first and second capacitors are coupled in parallel between a first one of the second terminals and a second one of the second terminals;
    in the second switch configuration, the first and second capacitors are coupled in series between a first one of the first terminals and a second one of the first terminals;
    in the third switch configuration, the first and second capacitors are coupled in parallel between the first one of the first terminals and the second one of the first terminals; and
    in the fourth switch configuration, the first and second capacitors are coupled in series between the first one of the second terminals and the second one of the second terminals.

7. The device of claim 5, wherein the switched capacitor network includes:
    a first capacitor;
    a second capacitor;
    a first switch coupled between a first one of the first terminals and a first end of the second capacitor;
    a second switch coupled between a second one of the second terminals and a second end of the first capacitor;

a third switch coupled between the second end of the first capacitor and a node, wherein the node is coupled to a second one of the first terminals and a first one of the second terminals;
a fourth switch coupled between the first end of the second capacitor and the node;
a fifth switch coupled between a second end of the second capacitor and the second end of the first capacitor;
a sixth switch coupled between the first end of the first capacitor and a first end of the second capacitor; and
a seventh switch coupled between the first end of the first capacitor and a second end of the second capacitor.

8. The device of claim 1, wherein the switched capacitor network is configured as a step-up converter.

9. The device of claim 8, wherein the switched capacitor network comprises:
a capacitor;
a first switch coupled between a first one of the first terminals and a first end of the capacitor;
a second switch coupled between the first one of the first terminals and a second end of the capacitor;
a third switch coupled between a second one of the first terminals and the second end of the capacitor;
a fourth switch coupled between the first end of the capacitor and a first one of the second terminals; and
a fifth switch coupled between the second end of the capacitor and the first one of the second terminals, wherein the second one of the first terminals is coupled to a second one of the second terminals.

10. The device of claim 9,
wherein the controller is further configured to:
in a first part of a period of the alternating current, cause current to flow from the battery to the energy storage, and
in a second part of the period of the alternating current, cause current to flow from the energy storage to the battery;
wherein the controller is further configured to control the switched capacitor network to repeatedly change between a first switch configuration and a second switch configuration during the first part of the period of the alternating current, and to repeatedly change between a third switch configuration and a fourth switch configuration during the second part of the period of the alternating current;
wherein in the first switch configuration, the first and third switches are closed, and the second, fourth and fifth switches are open;
wherein in the second switch configuration, the second and fourth switches are closed, and the first, third and fifth switches are open;
wherein in the third switch configuration, the third and fourth switches are closed, and the first, second and fifth switches are open; and
wherein in the fourth switch configuration, the first and fifth switches are closed, and the second, third and fourth switches are open.

11. The device of claim 8, wherein a step-up ratio of the step-up converter is a:b, a and b being integer numbers, with a>b, and wherein a number of capacitors of the switched capacitor network is at least a+1.

12. The device of claim 1, further comprising the energy storage, wherein the energy storage comprises at least one of a capacitor or a coil.

13. The device of claim 1, wherein the second terminals are configured to be connected to a further battery as the energy storage, and wherein the device further comprises:

a further voltmeter configured to measure a voltage across the further battery, and
a further amperemeter configured to measure an alternating current flowing to or from the further battery.

14. The device of claim 13, wherein the controller is further configured to determine a further battery impedance of the further battery based on the measured alternating current flowing to or from the further battery and the voltage across the further battery.

15. The device of claim 13, further comprising the battery and the further battery.

16. The device of claim 1, wherein one of the first terminals and one of the second terminals form a common terminal or are directly connected with each other.

17. A method for battery impedance measurement, comprising:
operating a switched capacitor network coupled between a battery and an energy storage to cause an alternating current to flow between the battery and the energy storage over a plurality of first cycles at a first frequency, wherein in each of the plurality of first cycles, operating the switched capacitor network comprises
causing the switched capacitor network to transfer charge from battery to the energy storage over a plurality of adjacent second cycles, and
causing the switched capacitor network to transfer charge from the energy storage to the battery over a plurality of adjacent third cycles, wherein a frequency of the second cycles and a frequency of the third cycles is greater than the first frequency; and
measuring the alternating current flowing to or from the battery using an amperemeter, and measuring a voltage across the battery using a voltmeter.

18. The method of claim 17, further comprising determining a battery impedance of the battery based on the measured alternating current to or from the battery and the measured voltage across the battery.

19. The method of claim 17, wherein operating the switched capacitor network comprises operating the switched capacitor network such that the alternating current has a rectangular waveform.

20. A system comprising:
a battery;
an energy storage device;
a switched capacitor network comprising a capacitor and a plurality of switches coupled to the capacitor, wherein at least one first switch of the plurality of switches is coupled to the battery, and least one second switch of the plurality of switches is coupled to the energy storage device, wherein the switched capacitor network is configured to cause an alternating current to flow between the battery and the energy storage over a plurality of first cycles at a first frequency, wherein in each of the plurality of first cycles the switched capacitor network is configured to:
transfer charge from battery to the energy storage over a plurality of adjacent second cycles, and
transfer charge from the energy storage to the battery over a plurality of adjacent third cycles, wherein a frequency of the second cycles and a frequency of the third cycles is greater than the first frequency;
a clock generation circuit coupled to control nodes of the plurality of switches of the switched capacitor network;
a voltmeter coupled to switched capacitor network;
an amperemeter coupled to the switched capacitor network; and a controller coupled to the voltmeter and to the amperemeter, wherein the controller is configured to calculate a complex impedance based on measurements provided by the voltmeter and the amperemeter.

\* \* \* \* \*